United States Patent
Doan et al.

[11] Patent Number: 5,946,595
[45] Date of Patent: Aug. 31, 1999

[54] METHOD OF FORMING A LOCAL INTERCONNECT BETWEEN ELECTRONIC DEVICES ON A SEMICONDUCTOR SUBSTRATE

[75] Inventors: Trung T. Doan, Boise; Zhiqiang Wu; Li Li, both of Meridian, all of Id.

[73] Assignee: Micron Technology, Inc., Boise, Id.

[21] Appl. No.: 08/818,637

[22] Filed: Mar. 14, 1997

[51] Int. Cl.$^6$ .................................................. H01L 21/44
[52] U.S. Cl. ......................... 438/659; 438/683; 438/705
[58] Field of Search ................................... 438/659, 683, 438/656, 705, 697, 647, 651

[56] References Cited

U.S. PATENT DOCUMENTS

| | | | |
|---|---|---|---|
| 4,093,503 | 6/1978 | Harris et al. | 156/628 |
| 4,571,817 | 2/1986 | Birritella et al. | 437/18 |
| 5,350,484 | 9/1994 | Gardner et al. . | |
| 5,358,908 | 10/1994 | Reinberg et al. | 437/228 |
| 5,431,777 | 7/1995 | Austin et al. . | |
| 5,484,740 | 1/1996 | Cho | 437/40 |
| 5,518,966 | 5/1996 | Woo . | |
| 5,587,338 | 12/1996 | Tseng . | |
| 5,599,736 | 2/1997 | Tseng . | |
| 5,624,871 | 4/1997 | Teo et al. . | |
| 5,736,459 | 4/1998 | Tseng . | |

OTHER PUBLICATIONS

U. Schnakenberg et al., TMAHW Etchants For Silicon Micromachining, 91CH2817–5/91/000–0815, IEEE, 815–818, 1991.

G. L. Kuhn et al., Thin Silicon Film on Insulating Substrate, J. Electrochem. Soc. Solid State Science and Technology, vol. 120, No. 11, 1563–1566, 1973.

Super Q Etch, Olin Electronic Materials, Olin Corporation, Chandler, AZ (1993).

Box Cell, Toshiba (date unknown).

*Primary Examiner*—Caridad Everhart
*Attorney, Agent, or Firm*—Workman, Nydegger & Seeley

[57] ABSTRACT

Disclosed is a method for forming a local interconnect with a self-aligned titanium silicide process on a semiconductor substrate. The initial step of the method is to form a thin titanium layer over the electronic devices to be provided with electrical communication. A polysilicon layer is then formed over the thin titanium layer, and in a further step, an implant mask is formed over portions of the polysilicon layer so as to pattern an area where the local interconnect is desired to be formed. Ions are then implanted into the polysilicon layer exposed by the implant mask, and the implant mask is then removed. In a further step, an etch process that etches either implanted or unimplanted polysilicon and is selective to the other is conducted. The remaining implanted polysilicon and titanium layers are then annealed to form titanium silicide, and the titanium that is not converted to titanium silicide is removed.

41 Claims, 5 Drawing Sheets

METHOD OF FORMING A LOCAL INTERCONNECT BETWEEN ELECTRONIC DEVICES ON A SEMICONDUCTOR SUBSTRATE

BACKGROUND OF THE INVENTION

1. The Field of the Invention

The present invention relates to methods for forming a local interconnect on a semiconductor substrate. More particularly, the present invention relates to methods of forming a local interconnect from refractory metal silicides on a semiconductor substrate. The method of the present invention is particularly useful in forming self-aligned titanium silicide local interconnects in a manner that is less complex and more reliable than conventional methods.

2. The Relevant Technology

Integrated circuits are currently manufactured by an elaborate process in which a multitude of electronic devices are integrally formed on a small silicon wafer. The conventional electronic devices which are formed on the silicon wafer include capacitors, resistors, transistors, diodes, and the like. In advanced manufacturing of integrated circuits, hundreds of thousands of these electronic devices are formed on a single silicon wafer.

One step in the process of manufacturing integrated circuits is to provide electrical communication between the discrete electronic devices on the integrated circuit. Structures for electrically interconnecting electronic devices or portions of electronic devices are broadly referred to as contacts. One form of contact for electrically interconnecting electronic devices on an integrated circuit wafer is with a local interconnect. The local interconnect generally comprises a region of conducting material formed between the electronic devices or portions of the electronic devices and allows for an electrical current to be delivered to and from the electronic devices or portions thereof so that the integrated circuit can perform its intended function.

The computer industry is constantly under market demand to increase the speed at which integrated circuits operate, to decrease the size of the integrated circuits, and to reduce the price of the integrated circuits. To accomplish this task, the electronic devices on a silicon wafer are continually being increased in number and decreased in dimension in a process known as miniaturization. In turn, the dimensions of the local interconnect must also be decreased.

The existing conventional technology for forming local interconnects is currently a limiting factor in the miniaturization of integrated circuits. Also, certain shortcomings in the conventional technology for forming local interconnects place limitations on the speed and efficiency of integrated circuits. The conventional technology also substantially increases the cost of forming the integrated circuits.

A currently technology being used for forming local interconnects is a method involving the self-aligned formation of titanium silicide. The resulting structure is known as titanium salicide. This conventional method for forming a local interconnect from titanium salicide is illustrated in FIGS. 1 through 7 and will be briefly discussed in order to better illustrate the shortcomings of the conventional method.

As shown in FIG. 1, the first step in the conventional method for forming a titanium salicide local interconnect is to provide the electronic devices that are to be placed in electrical communication by the local interconnect. Thus, shown in FIG. 1 is a silicon substrate 10 of an in-process integrated circuit wafer having formed thereon field oxide spacers 12 as well as active regions 14*a*, 14*b*, and 14*c*. Also formed thereon are a first gate region 18*a*, second gate region 16, and third gate region 18*b*. Each of gate region 18*a*, 18*b*, and 16 is formed with an integral pair of spacers 20 formed at its outer edges. In the depicted embodiment, shown as a representative example of the use of local interconnects, second gate region 16 forms the gate region of a MOS transistor and first and third gate regions 18*a* and 18*b* form word lines of a MOS memory device and are located atop field oxide spacers 12. In the depicted embodiment of FIGS. 1 through 7, three local interconnects are being constructed for use in electrically connecting gate regions 16, 18*a*, hand 18*b* with adjoining active regions 14*a*, 14*b*, and 14*c* respectively.

FIG. 2 depicts a subsequent step of the conventional method of forming local interconnects, wherein a thin titanium layer 22 is formed over the surface of gate regions 16, 18*a*, and 18*b*, and active regions 14*a*, 14*b*, and 14*c*. Thin titanium layer 22 is typically formed with a deposition process such as physical vapor deposition (PVD).

Thereafter, as shown in FIG. 3, a polysilicon layer 24 is formed over the top of thin titanium layer 22. Conventional methods of depositing polysilicon layer 24 typically involve a process of decomposition of a precursor material such as disilane.

FIG. 4 illustrates a subsequent step of the conventional method involving the formation of a photoresist mask 26 over portions of polysilicon layer 24 where the local interconnects are to be formed. Photoresist mask 26 is formed using photolithography.

Once photoresist mask 26 is in place, the portions of polysilicon layer 24 which are not covered by photoresist mask 26 are etched. The etch process typically comprises a vapor or "dry" etch using an etchant that etches silicon at a high rate, but optimally, is selective to titanium. The result of the etch process is showed in FIG. 5. As shown therein, titanium layer 22 remains, but polysilicon layer 24 remains only over the portions where photoresist mask 26 covered polysilicon layer 24.

After etching polysilicon layer 24, photoresist mask 26 is removed. The in-process integrated circuit wafer is then annealed in an atmosphere of gaseous nitrogen with a process of rapid thermal annealing. As depicted in FIG. 6, the rapid thermal anneal converts the portions of thin titanium layer 22 which are covered with polysilicon silicon layer 24 into regions of titanium silicide 28. The portions of thin titanium layer 24 which are not covered with polysilicon layer 24 but which are exposed by the etching of polysilicon layer 24 are converted into regions of titanium nitride 30.

As a final step in the conventional method, an etch is conducted to remove the portions of thin titanium layer 22 which have been converted to regions of titanium nitride 30. The titanium nitride etch is conducted with an etchant which is selective to titanium silicide, and results in the structure of FIG. 7, wherein patterned regions of titanium silicide 28 remain. The patterned regions of titanium silicide 28 will then be used to form completed titanium salicide local interconnects, providing pathways for electrical communication linking gate regions 18*a*, 16, and 18*b* with active regions 14*a*, 14*b*, and 14*c*, respectively.

One shortcoming involved with this conventional method of forming titanium salicide local interconnects is the inherent complex nature of the method. The method involves numerous intricate steps that add time and expense to the integrated circuit manufacturing process, thereby elevating the cost of the finished integrated circuit.

A further shortcoming of the conventional method involves the process of etching polysilicon layer 24. One undesirable side effect of the polysilicon etching process is that the etchant typically undercuts photoresist mask 26, thus etching into portions of polysilicon layer 24 which are covered and are not intended to be etched. The undercutting thus alters the critical dimensions of the etch.

Another drawback to the polysilicon etching process of the conventional method is that it has difficulty in maintaining a high selectivity to titanium. Conventional polysilicon etch processes etch silicon at a high rate, but are not as selective to titanium as desired, and have a tendency to etch into thin titanium layer 22. When this occurs, the etch often breaks through thin titanium layer 22, and into underlying active regions 14a and 14b. As active regions 14a, 14b, and 14c are formed from silicon substrate 10, to which the etch is not selective, the etchant quickly etches into and may substantially deplete underlying active regions 14a, 14b, and 14c. Damage of active regions 14a, 14b, and 14c causes junction degradation, which results in device failure and consequent lower yield rates of the integrated circuit manufacturing process.

A further area where the conventional local interconnect formation process can be improved is in lowering the resistivity of the resulting titanium salicide local interconnects. Titanium salicide, if not properly formed and doped, has an inherent resistivity that lowers electronic device speeds and subsequently, the performance of the completed integrated circuit. High resistivity is also a barrier to miniaturization. Properly forming and doping the titanium salicide, so as to lower resistivity, increases the complexity and cost of the integrated circuit formation process.

Accordingly, from the above discussion, it is apparent that what is needed in the art is a method whereby local interconnects can be formed in a less complex manner, without the tendency to undercut and overetch, and preferably with a lower resistivity in order to increase the speed of the electronic device into which the local interconnects are incorporated.

SUMMARY OF THE INVENTION

An improved method is provided for forming a local interconnect from a refractory metal silicide. The first step of the method of the present invention is to provide a plurality of electronic devices which are to be electrically connected by local interconnects. Thereafter, a refractory metal layer is formed over the electronic devices. In one embodiment, the refractory metal layer comprises a thin titanium layer. In a further step of the method of the present invention, a layer of silicon-containing material is deposited over the refractory metal layer. One preferred silicon-containing material is polysilicon. Amorphous silicon is also a preferred silicon-containing material.

In a subsequent step, an implant mask is formed over the layer of silicon-containing material. The implant mask is patterned to cover portions of the layer of the silicon-containing material which are intended to be removed and to leave exposed portions of the layer of the silicon-containing material that are to remain. Afterwards, a plurality of ions of a material such as arsenic, boron, argon, or phosphorous are implanted to heavily implant the exposed portions of the layer of silicon-containing material, leaving the covered portions of the layer of silicon-containing material that are covered by the implant mask substantially unimplanted.

The implant mask is then removed, and an etching process which is selective to implanted silicon-containing material is conducted to remove the unimplanted portions of the layer of silicon-containing material. An annealling process is then conducted to react the remaining implanted portions of the layer of silicon-containing material together with the portions of the thin refractory metal layer situated under the remaining implanted portions of the layer of silicon-containing material into regions of refractory metal silicide. Afterwards, those portions of the thin refractory metal layer which are unreacted, in that they have not formed a refractory metal silicide, are removed.

In one embodiment, the unreacted refractory metal comprises a thin titanium nitride layer that is removed following the anneal step conducted in an atmosphere of gaseous nitrogen. The anneal in a nitrogen atmosphere causes the portions of the thin titanium layer which are not covered with silicon-containing material to react and form the thin layer of titanium nitride. An etching process is then conducted which etches and removes the thin layer of titanium nitride but is selective to the regions of refractory metal silicide layer.

The result is a patterned refractory metal silicide layer which forms low resistivity local interconnects. The method is less complex than that of the prior art and avoids the problems of undercutting the photoresist layer and over-etching into the thin titanium layer and the underlying active regions.

BRIEF DESCRIPTION OF THE DRAWINGS

A more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
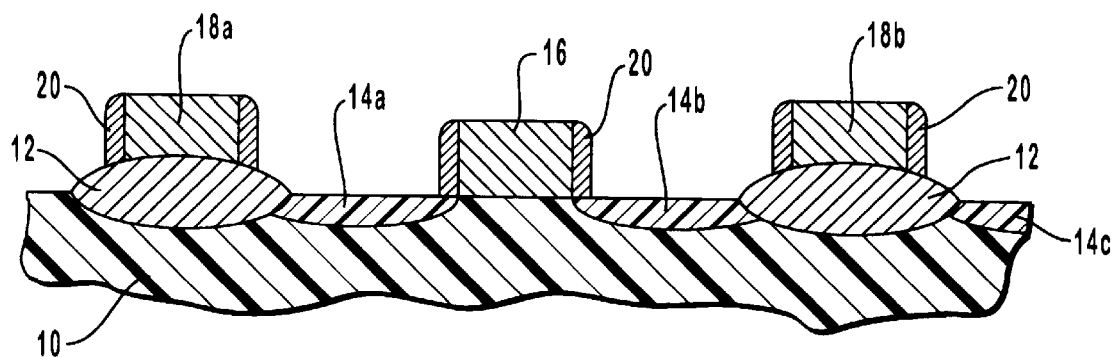
FIG. 1 is a cross-sectional view of a portion of an in-process integrated circuit wafer showing an initial step in the conventional method of forming local interconnects of providing electronic devices to be connected by the local interconnects.

FIG. 1 depicts an initial step in the method of the present invention. This initial step, similar to that of the conventional method, comprises providing the electronic devices which are to be connected by the local interconnects that are being formed. Thus, shown in FIG. 1 is a substrate assembly in the form of silicon substrate 10 of an in-process integrated circuit wafer having formed thereon electronic devices and portions thereof which are to be provided with electrical communication by the formation of local interconnects. The electronic devices which are intended to be connected by the local interconnects in the depicted embodiment include word line gate region 18a, which is to be connected with active region 14a. Word line gate region 18b is also intended to be connected with active region 14c.

Also included in FIG. 1 are word line gate regions 18a and 18b which are located atop field oxide spacers 12. Shown formed between word line gate regions 18a and 18b is a transistor comprised of active regions 14a and 14b and transistor gate region 16. In an additional aspect of the method of the present invention, transistor gate region 16 and active region 14b must be prepared for connection to other levels of the in-process integrated circuit wafer by the formation of contacts, and are to be provided with refractory metal silicide contact pads.

Figure 2:
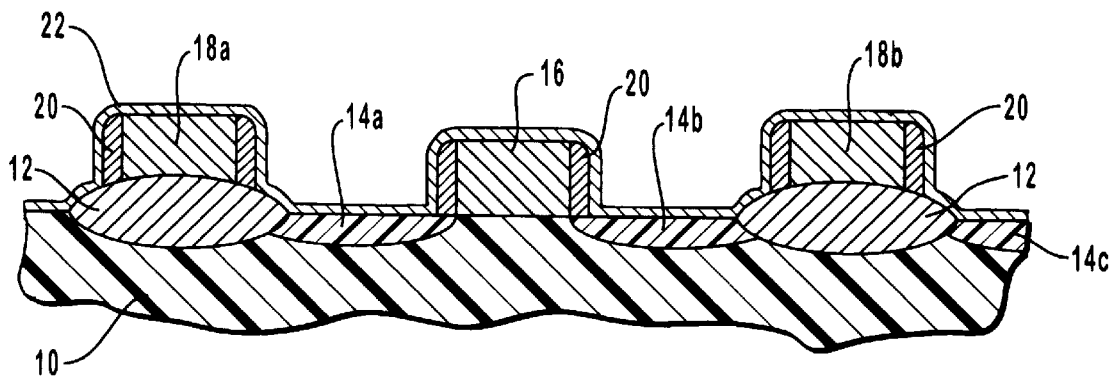
FIG. 2 is a cross-sectional view of the portion of an in-process integrated circuit wafer of FIG. 1 showing a subsequent step in the conventional method of forming local interconnects of depositing a thin titanium layer over the electronic devices.

In a further step in the method of the present invention, also similar to the conventional method, and as shown in FIG. 2, a conductive element, preferably a thin refractory metal layer, is formed over the structure of FIG. 1. The thin refractory metal can comprise, for instance, titanium, cobalt, or tungsten. In the embodiment of FIG. 2, the thin refractory metal layer comprises thin titanium layer 22. Thin titanium layer 22 is typically formed with a process such as physical vapor deposition, but can be formed in any suitable manner known in the art.

Figure 3:
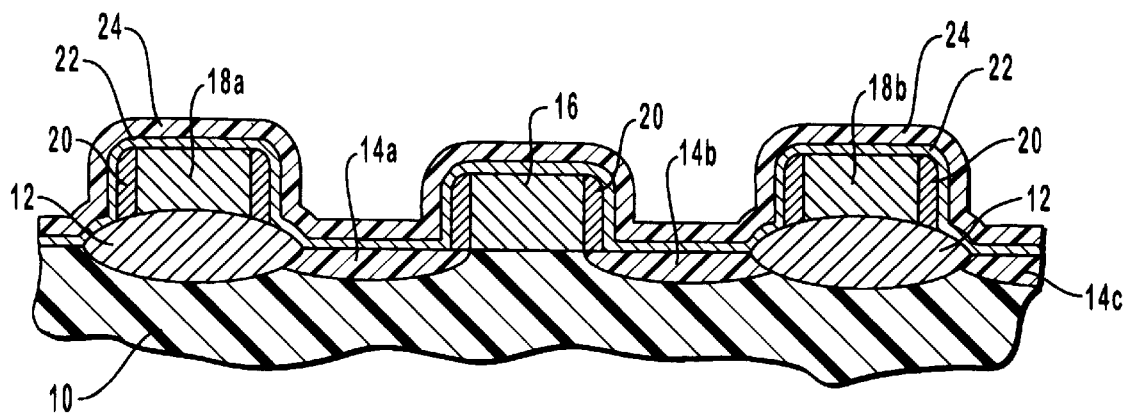
FIG. 3 is a cross-sectional view of the portion of an in-process integrated circuit wafer of FIG. 2 showing a subsequent step in the conventional method of forming local interconnects of depositing a polysilicon layer over the thin titanium layer.
Figure 4:
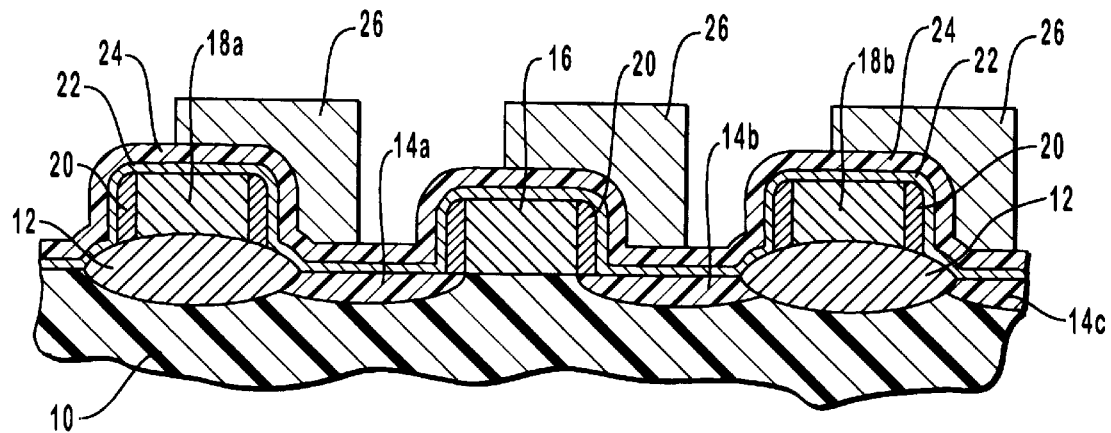
FIG. 4 is a cross-sectional view of the portion of an in-process integrated circuit wafer of FIG. 3 showing a subsequent step in the conventional method of forming local interconnects of masking selected portions of the polysilicon layer with a photoresist mask.
Figure 5:
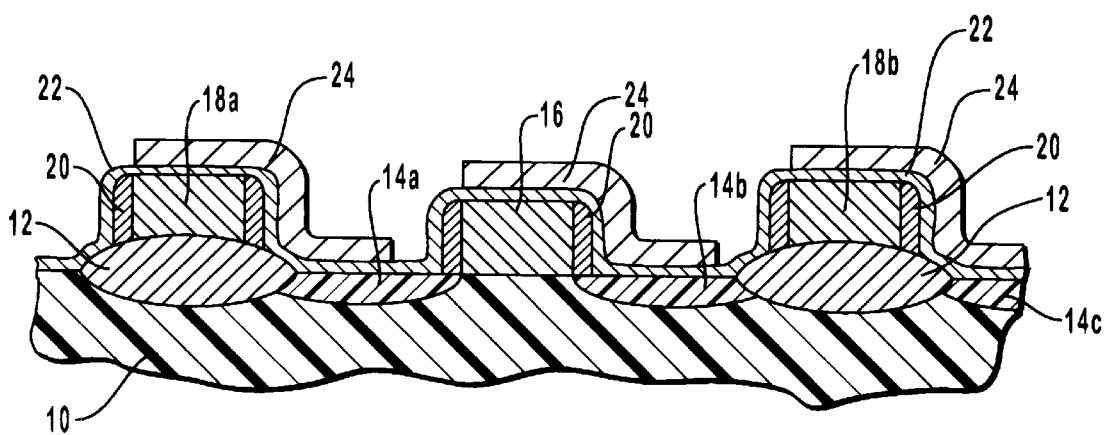
FIG. 5 is a cross-sectional view of the portion of an in-process integrated circuit wafer of FIG. 4 showing subsequent steps in the conventional method of forming local interconnects of etching the polysilicon and removing the photoresist mask.
Figure 6:
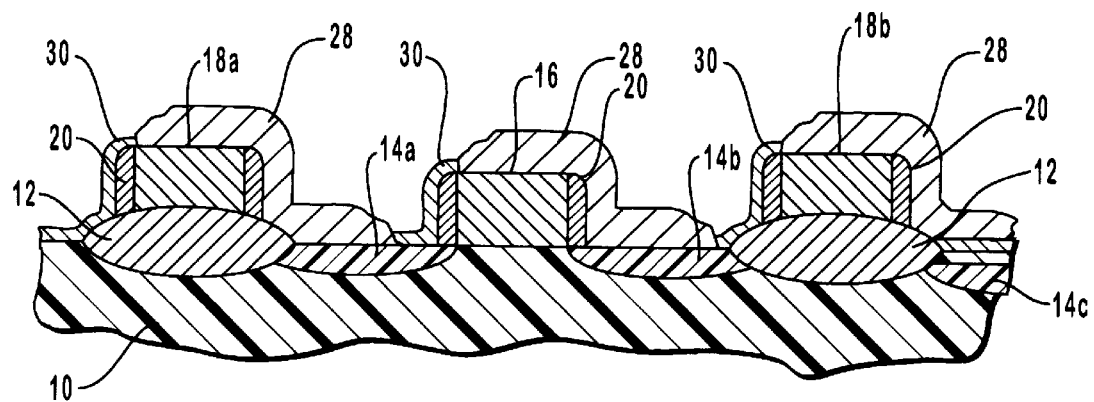
FIG. 6 is a cross-sectional view of the portion of an in-process integrated circuit wafer of FIG. 5 showing a subsequent step in the conventional method of forming local interconnects of annealing the in-process integrated circuit in an atmosphere of gaseous nitrogen to form regions of titanium silicide and regions of titanium nitride.
Figure 7:
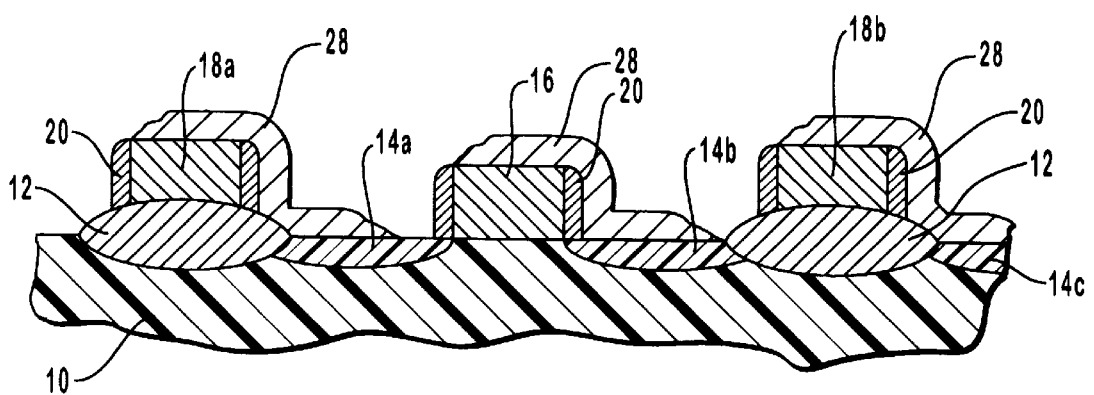
FIG. 7 is a cross-sectional view of the portion of an in-process integrated circuit wafer of FIG. 6 showing the titanium salicide local interconnects resulting from the conventional method of forming titanium salicide local interconnects.

A further step of the method of the present invention is shown in FIG. 3. In this step, as with the conventional method, a layer of silicon-containing material is deposited. Suitable selections for the silicon-containing material include polysilicon, amorphous silicon, and epitaxial silicon. In the embodiment of FIG. 3, the layer of silicon-containing material comprises polysilicon layer 24 deposited on thin titanium layer 22. Polysilicon layer 24 can be deposited with any suitable process known in the art.

Figure 8:
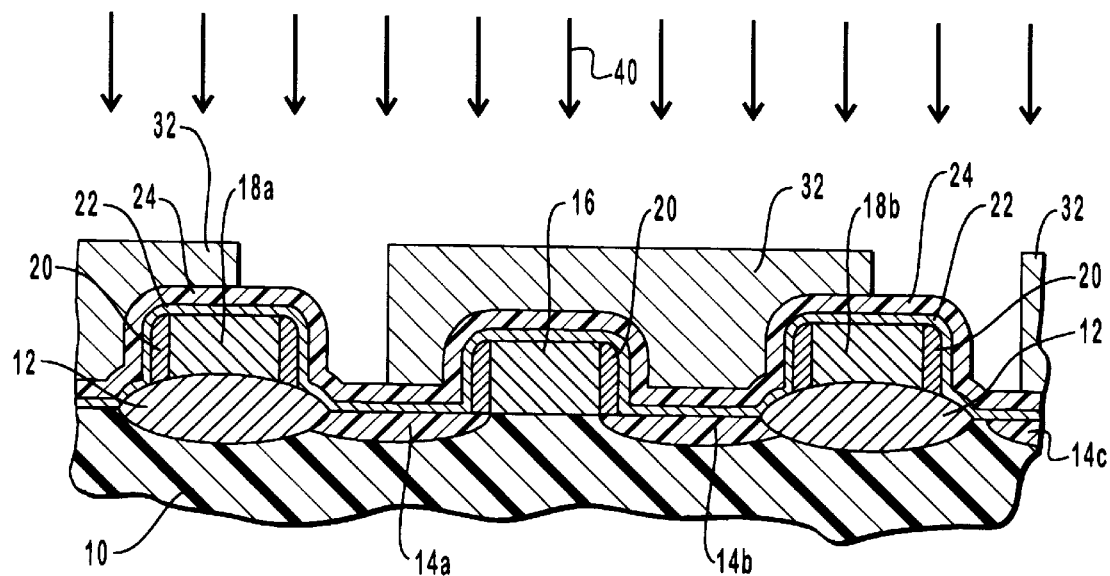
FIG. 8 is a cross-sectional view of the portion of an in-process integrated circuit of FIG. 3 showing steps in the method of the present invention of forming an implant mask for the implantation of the exposed portions of the polysilicon layer.

The next step of the method of the present invention is illustrated in FIG. 8 and comprises the formation of an implant mask. Thus, in FIG. 8, an implant mask 32 is shown formed on polysilicon layer 24. Implant mask 32 is preferably formed from photoresist that is deposited and patterned with photolithography in a conventional manner known in the art.

The next step in the method of the present invention is to implant ions, represented by arrows 40 in FIG. 8, into the portions of polysilicon layer 24 which are left exposed and uncovered by implant mask 32. The ions are of a type that preferably comprises a common silicon and polysilicon dopant such as arsenic, phosphorus, argon, or boron. The ions are implanted with an implantation dose in a range from about $1 \times 10^{13}$ ions per square centimeter to about $1 \times 10^{17}$ ions per square centimeter. Preferably, the implantation dose is selected to result in approximately $1 \times 10^{15}$ ions per square centimeter. The implantation energy is selected according to the thickness of polysilicon layer 24, as is commonly known in the art.

A further step is to remove implant mask 32, after which an etch process is conducted which etches the unimplanted silicon-containing material at a substantially faster rate than it etches the implanted silicon-containing material. The etch process preferably has an etch chemistry that is highly selective to the thin refractory metal layer. Thus, in the depicted embodiment, the etch process does not etch thin titanium layer 22 and consequently does not penetrate into underlying active regions 14a 14b, and 14c. One example of such an etching process comprises the use of tetramethyl ammonium hydroxide (TMAH) in solution. Preferably about 1.5 to about 5 volume percent TMAH is used in deionized water in the selective etching process. More preferably, the selective etching process comprises about 2.5 volume percent of TMAH in deionized water. The selective etching process is conducted at a temperature of from about 10° C. to about 50° C. More preferably, the selective etching process is conducted at a temperature of about 30° C.

Of course, the reverse of this etching process could also be conducted, in which case regions of polysilicon layer 24 which are to be removed are implanted and regions that are to remain and form titanium silicide local interconnects are unimplanted. In such a case, an etching process which etches implanted polysilicon at a substantially faster rate than it etches unimplanted polysilicon would then be used to remove the implanted portions of polysilicon layer 24.

Figure 9:
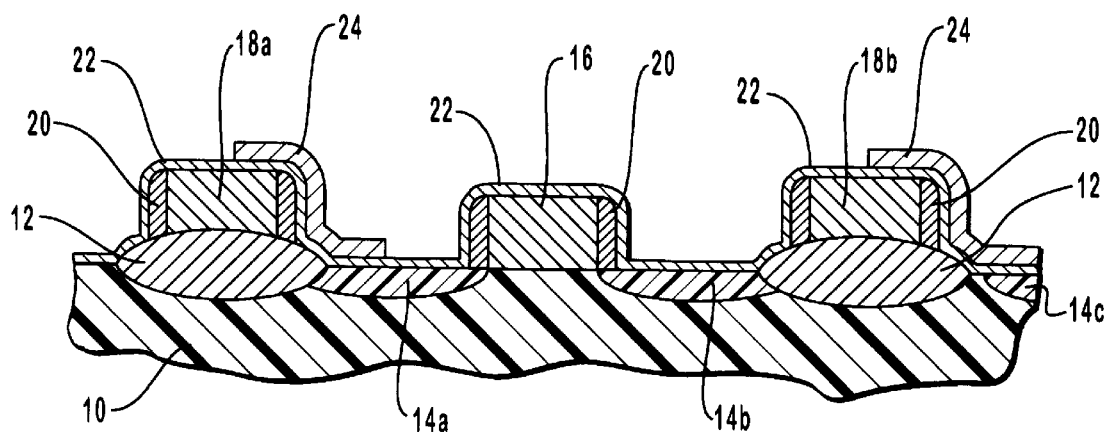
FIG. 9 is a cross-sectional view of the portion of an in-process integrated circuit of FIG. 8 showing subsequent steps in the method of the present invention of removing the implant mask and etching the unimplanted portions of the polysilicon layer.

The implant mask is subsequently removed to result in the structure shown in FIG. 9, wherein regions of polysilicon layer 24 which were not removed by the above-discussed steps of implanting ions and conducting a selective etching process remain.

Figure 10:
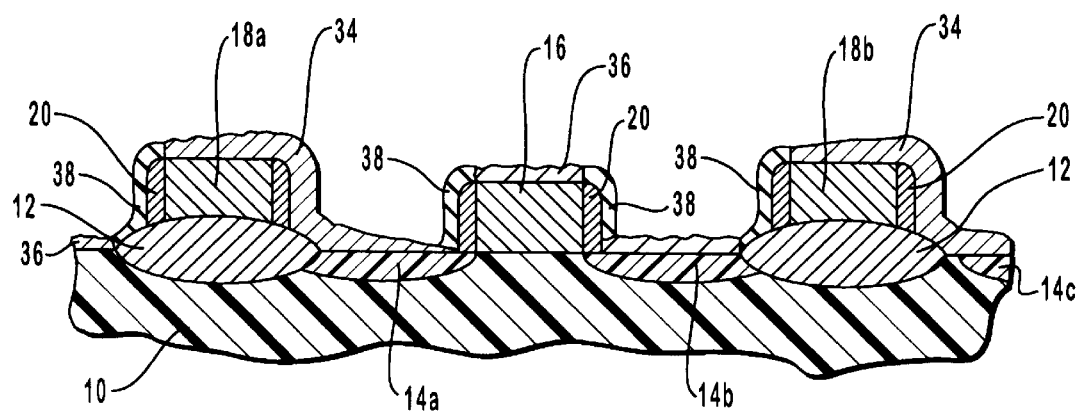
FIG. 10 is a cross-sectional view of the portion of an in-process integrated circuit of FIG. 9 showing a subsequent step in the method of the present invention of annealing the in-process integrated circuit in an atmosphere of gaseous nitrogen to form regions of titanium silicide and regions of titanium nitride.

After implant mask 32 is removed and polysilicon layer 24 is etched, a thermal treatment is conducted. The thermal treatment is preferably an anneal process and more preferably is conducted as a rapid thermal anneal. As shown in FIG. 10, the anneal process causes the regions of polysilicon layer 24 which remain after the etch to react with the portions of thin titanium layer 22 directly under the regions of polysilicon layer 24 that remain so as to form regions of titanium silicide.

A further step of the method of the present invention is to strip the portions of thin titanium layer 22 which have not formed regions of titanium silicide by reacting with the regions of polysilicon layer 24 that remain. In the embodiment depicted in FIG. 10, the unreacted titanium is stripped by conducting the thermal treatment in an atmosphere of nitrogen. This causes the portions of thin titanium layer 22 which are exposed as a result of the etching of polysilicon layer 24 to react and form regions of titanium nitride 38. The portions of thin titanium layer 22 that are covered by the regions of polysilicon layer 24 that remain are not converted to titanium nitride. Rather, as discussed, the portions of thin titanium layer 22 that are covered by the regions of polysilicon layer 24 that remain are converted by the anneal step to regions of titanium silicide, typically in a species of $Ti_3Si_5$.

Figure 11:
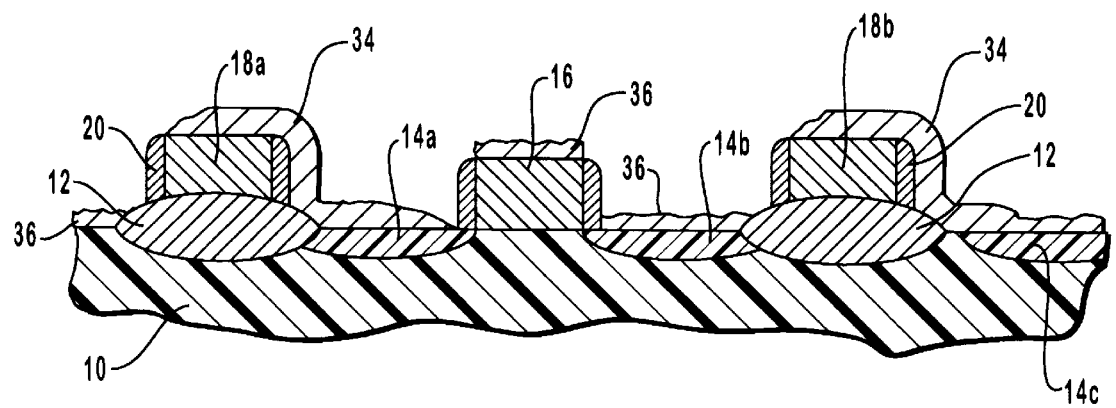
FIG. 11 is a cross-sectional view of the portion of an in-process integrated circuit of FIG. 10 showing the titanium silicide local interconnects and titanium silicide contact pads resulting from the method of the present invention.

Once the regions of titanium nitride are formed, they are then stripped with an etch process that is selective to titanium silicide. The etch process that is selective to titanium silicide can comprise, for example, a dual etch process utilizing combined $H_2SO_4:H_2O_2$ or $NH_4OH:H_2O_2$ etchants. The result of the etch is depicted in FIG. 11, wherein patterned regions of titanium silicide 34 can be seen. Also formed as a result of the present method are titanium silicide contact pads 36, which are formed by the reaction of thin titanium layer 22 with underlying silicon from transistor gate region 16 and active region 14b. Silicon contact pads 36 are useful in forming a diffusion barrier to act as an interface for contacts which are to be formed above transistor gate region 16 or active region 14b.

A final heat treatment is preferably conducted to convert the $Ti_3Si_5$ titanium silicide to a species substantially composed of $TiSi_2$. This concludes the local interconnect formation method, and the balance of the integrated circuit manufacturing process is then conducted to complete the integrated circuit.

The structure created by the inventive method is seen in FIG. 11, wherein a plurality of electronic devices are represented as a first gate region 18a situated on a first field oxide region 12, a second gate region 18b situated on second field oxide region 12, and a third gate region 16 in between the first and second gate regions 18a, 18b and situated on a silicon substrate 10 of an in-process integrated circuit wafer. In the depicted embodiment, first and second gate regions 18a and 18b comprise word lines of a MOS memory structure and third gate region 16 forms the gate region of a MOS transistor. A first active area 14a is situated in silicon substrate 10 between first gate region 14a and the third gate region 16. A second active area 14b is situated in silicon substrate 10 between third gate region 16 and second gate region 18b, and a third active area 14c is situated to the side of second gate region 18b. A layer of $TiSi_2$ electrically connects the top of first and second gate regions 18a and 18b with first and third active areas 14a and 14b respectively. A titanium silicide contact pad 36 is formed over each of third gate region 16 and second active area 14b.

The method of the present invention is easily incorporated into existing process flows, and maintains the throughput and yield levels of the process flows. The method of the present invention is additionally beneficial in that it uses a less complex etching process than conventional methods, because the polysilicon implantation and etching are conducted contemporaneously. The method also uses a more controllable polysilicon etch process which does not undercut into masked portions of polysilicon layer 24. Additionally, the more controllable etch process prevents over-etch into the titanium layer and the underlying active regions, thereby preventing degradation of the active regions. Furthermore, the local interconnects formed by the method of the present invention have a lower resistivity due to the implantation of ions which integrally dope the local interconnects, as well as to the more precise etching process. The lower resistivity translates into increased device speed and allows for greater miniaturization.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by united states letters patent is:

1. A method for forming a contact on a semiconductor substrate, comprising:

forming a layer of silicon-containing material over a layer of refractory metal located on a silicon substrate;

masking a first portion of the layer of silicon-containing material and leaving a second portion of the layer of silicon-containing material unmasked;

implanting a plurality of ions into the second portion of the layer of silicon-containing material;

removing the first portion of the layer of silicon-containing material; and reacting the layer of silicon-containing material with the layer of refractory metal to form a conductive silicide region.

2. A method as recited in claim 1, wherein the first portion is removed with an etching process that removes silicon-containing material from the first portion at a higher material removal rate than that of the second portion.

3. A method as recited in claim 1, wherein the layer of refractory metal is selected from the group consisting of titanium and tungsten.

4. A method as recited in claim 1, wherein the silicon-containing material is selected from the group consisting of polysilicon and amorphous silicon.

5. A method as recited in claim 1, wherein the ions are selected from the group consisting of phosphorous, boron, arsenic, and argon.

6. A method as recited in claim 1, wherein the ions are implanted into the second portion with an implantation dose in a range of about $1\times10^{13}$ ions per square centimeter to about $1\times10^{17}$ ions per square centimeter.

7. A method as recited in claim 1, wherein the ions are implanted into the second portion with an implantation dose of approximately $1\times10^{15}$ ions per square centimeter.

8. A method as recited in claim 1, wherein reacting the layer of silicon-containing material with the layer of refractory metal further comprises subjecting the semiconductor substrate to a heat treatment.

9. A method as recited in claim 1, wherein the conductive silicide region comprises titanium silicide.

10. A method as recited in claim 8, wherein the heat treatment comprises the use of a rapid thermal anneal process.

11. A method as recited in claim 1, wherein an unreacted portion of the layer of refractory metal remains unreacted after reacting the layer of silicon-containing material with the layer of refractory metal, and the method further comprising removing the unreacted portion of the layer of refractory metal.

12. A method as recited in claim 8, where the layer of refractory metal comprises a titanium layer, and wherein subjecting the semiconductor substrate to a heat treatment is conducted in an environment of nitrogen so as to convert the unreacted portion of the titanium layer to a region of titanium nitride, and the method further comprising removing the region of titanium nitride with an etching process that is selective to titanium silicide.

13. A method as recited in claim 12, wherein the etching process that is selective to titanium silicide is conducted with an etch chemistry selected from the group consisting of $H_2SO_4:H_2O_2$ and $NH_4OH:H_2O_2$.

14. A method as recited in claim 9, further comprising subjecting the semiconductor substrate to a second heat treatment to convert the titanium silicide to a species substantially composed of $TiSi_2$.

15. A method as recited in claim 2, wherein removing the first portion of the layer of silicon-containing material comprises exposing the first portion to TMAH having a volume percent of TMAH in solution in a range of from about 1.5 percent to about 5 percent.

16. A method for forming a local interconnect contact on a semiconductor substrate, the method comprising:
 forming a layer of refractory metal on the semiconductor substrate;
 forming a layer of silicon-containing material on the layer of refractory metal;
 forming an implant mask over the layer of silicon-containing material, the implant mask masking a first portion of the layer of silicon-containing material and leaving a second portion of the layer of silicon-containing material unmasked;
 implanting a plurality of ions into the second portion of the layer of silicon-containing material;
 removing the implant mask;
 removing the first portion of the layer of silicon-containing material with an etching process that removes silicon-containing material from the first portion at a higher material removal rate than that of the second portion; and
 removing a portion of the layer of refractory metal.

17. A method as recited in claim 16, wherein the layer of refractory metal is selected from the group consisting of titanium and tungsten.

18. A method as recited in claim 16, wherein the silicon-containing material is selected from the group consisting of polysilicon and amorphous silicon.

19. A method as recited in claim 16, wherein the ions are selected from the group consisting of phosphorous, boron, arsenic, and argon.

20. A method as recited in claim 16, wherein the ions are implanted with an implantation dose in a range of about $1 \times 10^{13}$ ions per square centimeter to about $1 \times 10^{17}$ ions per square centimeter.

21. A method as recited in claim 16, wherein the ions are implanted with an implantation dose of approximately $10^{15}$ ions per square centimeter.

22. A method as recited in claim 16, further comprising reacting the layer of silicon-containing material with the layer of refractory metal to form a conductive silicide region.

23. A method as recited in claim 22, wherein the conductive silicide region comprises titanium silicide.

24. A method as recited in claim 23, wherein the titanium silicide comprises $Ti_3Si_5$.

25. A method as recited in claim 22, wherein reacting the layer of silicon-containing material with the layer of refractory metal further comprises subjecting the semiconductor substrate to a heat treatment.

26. A method as recited in claim 25, wherein the heat treatment comprises the use of a rapid thermal anneal process.

27. A method as recited in claim 22, wherein an unreacted portion of the layer of refractory metal remains unreacted after reacting the layer of silicon-containing material with the layer of refractory metal, and the method further comprising removing the unreacted portion of the layer of refractory metal.

28. A method as recited in claim 24, wherein the layer of refractory metal comprises a titanium layer, the layer of silicon-containing material comprises a polysilicon layer, an unreacted portion of the titanium layer remains unreacted after the reaction between the polysilicon layer and the titanium layer, and subjecting the semiconductor substrate to a heat treatment is conducted in an environment of nitrogen so to convert the unreacted portion of the titanium layer to a region of titanium nitride, and further comprising removing the region of titanium nitride with an etching process that etches titanium nitride faster than titanium silicide.

29. A method as recited in claim 28, wherein the etching process that etches titanium nitride faster than titanium silicide is conducted with an etch chemistry selected from the group consisting of: $H_2SO_4:H_2O_2$ and $NH_4OH:H_2O_2$.

30. A method as recited in claim 23, further comprising subjecting the semiconductor substrate to a second heat treatment to convert the titanium silicide to a species substantially composed of $TiSi_2$.

31. A method as recited in claim 16, wherein removing the first portion of the layer of silicon-containing material comprises exposing the first portion to TMAH having a volume percent of TMAH in solution in a range of from about 1.5 percent to about 5 percent.

32. A method for forming a titanium silicide local interconnect contact on a semiconductor substrate, the method comprising:
 providing a gate region situated adjacent an active area on the semiconductor substrate;
 forming a titanium layer on the gate region and the active area;
 forming a polysilicon layer on the titanium layer;
 forming an implant mask on the polysilicon layer, the implant mask covering a first portion of the polysilicon layer and leaving a second portion of the polysilicon layer located over the top of the gate region and the active area unmasked;
 implanting a plurality of ions into the second portion with an implantation dose of about $1 \times 10^{15}$ ions per square centimeter;
 removing the implant mask;
 removing the first portion with an etching process that removes polysilicon from the first portion at a higher material removal rate than that of the second portion;
 subjecting the polysilicon layer and the titanium layer to a heat treatment with a rapid thermal anneal in an atmosphere of gaseous nitrogen to form a $Ti_3Si_5$ layer and a layer of titanium nitride;
 removing the layer of titanium nitride with an etching process that removes titanium nitride at a faster rate than titanium silicide; and conducting a second heat treatment to convert the titanium silicide to a species substantially composed of TiSi$_2$, whereby there is formed a layer of TiSi$_2$ situated on a top surface of the gate region and extending onto the active area.

33. A method as recited in claim 32, wherein the ions are of a type selected from the group consisting of boron, arsenic, phosphorous, and argon.

34. A method as recited in claim 32, wherein the ions are implanted with an implantation dose of approximately 10$^{15}$ ions per square centimeter.

35. A method as recited in claim 32, wherein removing the layer of titanium nitride is conducted with an etch chemistry selected from the group consisting of H$_2$SO$_4$:H$_2$O$_2$ and NH$_4$OH:H$_2$O$_2$.

36. A method as recited in claim 32, wherein removing the first portion comprises exposing the first portion to TMAH having a volume percent of TMAH in solution in a range of from about 1.5 percent to about 5 percent.

37. A method for forming a contact on a semiconductor substrate, the method comprising:

providing a volume of polysilicon on the semiconductor substrate proximate a desired location for the contact;

implanting a plurality of ions into a portion of the volume of polysilicon to define implanted and unimplanted regions thereof;

removing one of the implanted and unimplanted regions of the volume of polysilicon to define the contact;

providing a layer of refractory metal under the volume of polysilicon, and subjecting the semiconductor substrate to a heat treatment subsequent to removing one of the implanted and unimplanted regions of the volume of polysilicon, the heat treatment causing a reaction that results in a refractory metal silicide being formed in one of the implanted and unimplanted regions of the volume of polysilicon.

38. A method as recited in claim 37, wherein removing one of the implanted and unimplanted regions of the volume of polysilicon is conducted with an etch chemistry having a volume percent of TMAH in solution in a range from about 1.5 percent to about 5 percent.

39. A method as recited in claim 37, wherein the implanted region of the volume of polysilicon is removed to define the contact.

40. A method as recited in claim 37, wherein the volume of the polysilicon is implanted with ions selected from the group consisting of phosphorous, boron, arsenic, and argon.

41. A method as recited in claim 37, wherein removing one of the implanted and unimplanted regions of the volume of polysilicon is conducted with TMAH in solution.

* * * * *

UNITED STATES PATENT AND TRADEMARK OFFICE
CERTIFICATE OF CORRECTION

PATENT NO. : 5,946,595
DATED : Aug. 31, 1999
INVENTOR(S) : Trung T. Doan; Zhiqiang Wu; Li Li It is certified that error appears in the above-identified patent and that said Letters Patent is hereby corrected as shown below:

Col. 1, line 55, after "A" change "currently" to --current--

Col. 2, line 47, after "polysilicon" delete "silicon"

Col. 2, line 49, after "titanium layer" change "24" to --22--

Signed and Sealed this

Twenty-fifth Day of July, 2000

Attest:

Q. TODD DICKINSON

Attesting Officer

Director of Patents and Trademarks